US012638511B2

(12) United States Patent
Kendall et al.

(10) Patent No.: US 12,638,511 B2
(45) Date of Patent: May 26, 2026

(54) BATTERY CHARACTERISATION AND MONITORING SYSTEM

(71) Applicants:CDO2 LIMITED, Mayfield (GB); THE UNIVERSITY OF SUSSEX, Brighton (GB)

(72) Inventors: Gary Kendall, Rotherfield (GB); Matthew Withers, Hove (GB); Peter Kruger, Hove (GB); Mark Bason, Hove (GB)

(73) Assignees: CDO2 Limited, Mayfield (GB); The University of Sussex, Brighton (GB)

( * ) Notice: Subject to any disclaimer, the term of this patent is extended or adjusted under 35 U.S.C. 154(b) by 1068 days.

(21) Appl. No.: 17/640,641

(22) PCT Filed: Sep. 4, 2020

(86) PCT No.: PCT/GB2020/052119
§ 371 (c)(1),
(2) Date: Mar. 4, 2022

(87) PCT Pub. No.: WO2021/044155
PCT Pub. Date: Mar. 11, 2021

(65) Prior Publication Data
US 2022/0357402 A1 Nov. 10, 2022

(30) Foreign Application Priority Data

Sep. 4, 2019 (GB) ..................................... 1912735

(51) Int. Cl.
| | |
|---|---|
| *G01R 31/3828* | (2019.01) |
| *G01R 31/396* | (2019.01) |
| *G01R 33/02* | (2006.01) |

(52) U.S. Cl.
CPC ....... *G01R 31/3828* (2019.01); *G01R 31/396* (2019.01); *G01R 33/02* (2013.01)

(58) Field of Classification Search
CPC .. G01R 31/3828; G01R 31/396; G01R 33/02; G01R 15/20; G01R 31/392;
(Continued)

(56) References Cited

U.S. PATENT DOCUMENTS

| | | | | |
|---|---|---|---|---|
| 6,307,378 B1* | 10/2001 | Kozlowski | ........... | G01R 31/389 |
| | | | | 324/426 |
| 6,798,112 B1 | 9/2004 | Daley | | |

(Continued)

FOREIGN PATENT DOCUMENTS

| | | |
|---|---|---|
| DE | 102005024075 A1 | 11/2006 |
| EP | 1586912 A1 | 10/2005 |

(Continued)

OTHER PUBLICATIONS

Hu et al., "Sensitive magnetometry reveals inhomogeneities in charge storage and weak transient internal currents in Li-ion cells", PNAS, vol. 117 | No. 20, May 19, 2020 (Year: 2020).*

(Continued)

*Primary Examiner* — Jack Chiang
*Assistant Examiner* — Brandon Bowers
(74) *Attorney, Agent, or Firm* — Withrow + Terranova, PLLC; Vincent K. Gustafson

(57) ABSTRACT

A method for non-invasive characterisation of a cell for a battery is provided, the method comprising: measuring a magnetic field generated by the cell using a plurality of magnetic field sensors positioned adjacent to the cell, the measuring producing magnetic field sensor data, wherein the measuring is performed while the cell is in a passive state; determining current density profile data across the cell based on the magnetic field sensor data; and determining a condition of the cell using the current density profile data.

19 Claims, 6 Drawing Sheets

(58) Field of Classification Search

CPC . G01R 31/389; G01R 31/3865; H01M 10/48; H01M 10/54; H01M 10/049; H01M 10/446; H01M 10/4285; G01N 24/006; Y02E 60/10; Y02P 70/50; Y02W 30/84

See application file for complete search history.

(56) References Cited

U.S. PATENT DOCUMENTS

| | | | |
|---|---|---|---|
| 7,112,793 B2 | 9/2006 | Wright | |
| 7,230,436 B2 | 6/2007 | Terada et al. | |
| 7,956,598 B2 | 6/2011 | Ariyama | |
| 8,952,655 B2 | 2/2015 | Walley | |
| 9,086,460 B2 | 7/2015 | Rice et al. | |
| 9,304,173 B2 | 4/2016 | Fink | |
| 9,329,213 B2 | 5/2016 | Tsujimoto | |
| 9,377,512 B2 | 6/2016 | Frost et al. | |
| 9,461,485 B2 | 10/2016 | Koch | |
| 9,511,670 B2 | 12/2016 | Conell et al. | |
| 9,513,317 B2 | 12/2016 | Okuyama et al. | |
| 9,535,130 B2 | 1/2017 | Labbe et al. | |
| 9,599,584 B2 | 3/2017 | Yazami et al. | |
| 9,620,823 B2 | 4/2017 | Lohmann et al. | |
| 9,647,471 B2 | 5/2017 | Waterford | |
| 9,677,184 B2 | 6/2017 | Grant et al. | |
| 9,695,520 B2 | 7/2017 | Grant et al. | |
| 9,748,612 B2 | 8/2017 | Bergmann et al. | |
| 9,766,293 B2 | 9/2017 | Sims et al. | |
| 9,865,902 B2 | 1/2018 | Paganelli et al. | |
| 9,880,206 B2 | 1/2018 | Akimoto et al. | |
| 10,018,657 B2 | 7/2018 | Kaupp | |
| 10,044,229 B2 | 8/2018 | Partovi et al. | |
| 10,074,879 B2 | 9/2018 | Deane et al. | |
| 10,096,988 B2 | 10/2018 | Bailey | |
| 10,209,277 B2 | 2/2019 | Okuyama et al. | |
| 2004/0140799 A1* | 7/2004 | Romalis | G01R 33/02 |
| | | | 324/304 |
| 2007/0090844 A1 | 4/2007 | Klang | |
| 2008/0186021 A1 | 8/2008 | Hashio et al. | |
| 2012/0194198 A1* | 8/2012 | Moran | G01R 31/382 |
| | | | 324/201 |
| 2013/0057288 A1 | 3/2013 | Ogata et al. | |
| 2013/0154652 A1* | 6/2013 | Rice | H01M 10/48 |
| | | | 324/426 |
| 2013/0162258 A1* | 6/2013 | Patin | G01R 27/02 |
| | | | 324/426 |
| 2014/0272500 A1 | 9/2014 | Roumi et al. | |
| 2015/0160298 A1 | 6/2015 | Tabatowski-Bush | |
| 2015/0233980 A1 | 8/2015 | Umetsu et al. | |
| 2016/0002801 A1 | 1/2016 | Grant et al. | |
| 2016/0084911 A1 | 3/2016 | Mensah-Brown | |
| 2017/0153292 A1 | 6/2017 | Steiber et al. | |
| 2017/0207495 A1 | 7/2017 | Shen | |
| 2017/0261574 A1 | 9/2017 | Stainsby et al. | |
| 2018/0083253 A1 | 3/2018 | Dulle | |
| 2018/0149678 A1 | 5/2018 | Wolf et al. | |
| 2018/0259598 A1 | 9/2018 | Iriguchi | |
| 2018/0261875 A1 | 9/2018 | Imaji et al. | |
| 2018/0331396 A1 | 11/2018 | Soki et al. | |
| 2019/0011511 A1 | 1/2019 | Stainsby et al. | |
| 2019/0115857 A1 | 4/2019 | Sun et al. | |

FOREIGN PATENT DOCUMENTS

| | | | |
|---|---|---|---|
| EP | 2682766 B1 | 1/2014 | |
| EP | 2543096 B1 | 2/2014 | |
| JP | 2010277979 A | 12/2010 | |
| JP | 2011133259 A | 7/2011 | |
| JP | 2015021923 A | 2/2015 | |
| KR | 101243473 B1 | 3/2013 | |
| WO | 2014124038 A1 | 8/2014 | |
| WO | 2015185802 A1 | 12/2015 | |
| WO | 2016042488 A1 | 3/2016 | |
| WO | 2018106828 A1 | 6/2018 | |

OTHER PUBLICATIONS

Notification of Transmittal (Form PCT/ISA/220), International Search Report (Form PCT/ISA/210), and Written Opinion (Form PCT/ISA/237) for International Application No. PCT/GB2020/052119 mailed Oct. 30, 2020, 13 pages.

Search Report under Section 17(5) for United Kingdom Patent Application No. GB1912735.6 mailed Feb. 19, 2020, 3 pages.

Romanenko, K., et al., "Distortion-free inside-out imaging for rapid diagnostics of rechargeable Li-ion cells," PNAS vol. 16, No. 38, pp. 18783-18789, Sep. 17, 2019.

Green, J. E., et al., "Spatially Resolved Measurements of Magnetic Fields Applied to Current Distribution Problems in Batteries," IEEE Transactions on Instrumentation and Measurement, vol. 64, No. 4, pp. 951-958, Apr. 2015.

* cited by examiner

BATTERY CHARACTERISATION AND MONITORING SYSTEM

This application is a 35 U.S.C. § 371 national phase filing of International Application No. PCT/GB2020/052119, filed on Sep. 4, 2020, and claims the benefit of United Kingdom Patent Application No. 1912735.6, filed on Sep. 4, 2019, wherein the entire contents of the foregoing applications are hereby incorporated by reference herein.

FIELD

The present invention relates to a method and system for the characterisation of battery cells, battery modules and battery packs through non-invasive measurement techniques. The invention is particularly useful for, but not limited to, the characterisation of lithium-ion battery cells, such as those used in electric vehicles.

The present invention is also particularly useful when employed in the analysis of battery cells post component production in order to detect defects in cells during a pre-use conditioning stage that is part of the fabrication process.

BACKGROUND

Recently, much attention has been attracted to electricity storage technologies including battery cells such as those in lithium-ion batteries. Lithium-ion cells can produce high voltage (e.g. approximately 3.7 V) and have high energy densities because the battery uses a nonaqueous electrolyte. As a result, the lithium-ion battery is particularly useful in applications such as electric and hybrid vehicles because the lithium-ion battery can produce the high voltages required for the vehicle whilst being relatively lightweight and of a small size.

One issue with lithium-ion cells is that internal structures having a high surface area have a tendency to form on and around the negative electrode when the cell is being charged. Exemplary high surface area structures include dendrites and mossy structures.

Dendrites are a common failure mode for cells with lithium metal anodes. The dendrites form with a needle-like structure and can grow through the cell during charging and discharging, resulting in internal currents and ultimately resulting in an internal short circuit. These may be "soft shorts" that burn out rapidly, resulting in a temporary self-discharge of the cell, or "strong shorts" consisting of a higher, more stable contact area that can lead to complete discharge of the cell, cell failure, and even thermal runaway.

Lithium-ion cells must undergo a conditioning stage after they have been manufactured (also referred to as lithiation). During this conditioning phase the cells have a charge for the first time (the initial charge being produced inherently during manufacturing by the nature of the lithium-ion cell) and a layer builds up on the anode known as the solid electrolyte interface (SEI). The SEI is electrically insulating but has sufficient ionic conductivity to allow the battery to function normally. While the SEI layer therefore slightly lowers the capacity, it also protects the battery. The SEI layer plays an important role in the prevention of dendrite growth during the lifetime of a cell, which occurs through repeated cycling of the cell. It would therefore be desirable to identify any irregularities in the SEI layer and detect defects such as the growth of dendrites early on in the lifetime of the battery cell, preferably during the conditioning stage.

In a typical conditioning stage, battery cells are left for four weeks or so in a temperature controlled (e.g. 30-50° C.)

room to age before being given a discharge-charge cycle test to measure capacity. Based upon this capacity it is determined whether or not battery cells are faulty (e.g. there is a fault in the SEI layer or substantial dendrites have formed).

As every battery cell that is manufactured must typically undergo the conditioning stage, large amounts of temperature controlled space are required for the storage of the battery cells whilst this is performed. It is expensive and environmentally unfriendly to maintain large temperature controlled areas, and such areas could typically take up a large proportion of factory floor space.

SUMMARY

In one aspect, the present invention provides a method for non-invasive characterisation of a cell for a battery, the method comprising: measuring a magnetic field generated by the cell using a plurality of magnetic field sensors positioned adjacent to the cell, the measuring producing magnetic field sensor data, wherein the measuring is performed while the cell is in a passive state; determining current density profile data across the cell based on the magnetic field sensor data; and determining a condition of the cell using the current density profile data.

The electrical charge storage device may be a cell for a battery, Whilst the below features are described in relation to a cell for a battery it will be appreciated that aspects of the present invention and the related optional features may also be applied to other electrical charge storage device including, but not limited to any of: a fuel cell; a super capacitor; an electrochemical device; and an electrostatic device.

By measuring the magnetic field using one or more sensors, the current density within the cell can be determined. The determining of the condition of the cell can be used to detect the above mentioned defects in cells earlier, for example, in the conditioning stage. By identifying defects earlier, faulty cells can be disposed of, thus reducing the amount of space required for the storage of cells in the conditioning stage and improving manufacturing efficiency.

Utilising this method therefore saves time in the conditioning process as it can be concluded earlier in the process that a battery cell is satisfactory (i.e. meets a predetermined standard), can improve capacity of the ageing room and can improve the quality of the cells selected from a batch that are being conditioned. Batteries that have been monitored using this method can be graded according to homogeneity and quality of manufacture, producing a higher value end product.

By passive, it is meant that substantially no load is applied to the cell during the measurement. In other words, the cell is part of an open circuit. As such, detected internal currents in the cell should be the result of (electrochemical) self-discharge as opposed to any active charging/discharging of the cell.

By non-invasive it is meant that the method can be applied to a cell without anything additional entering the cell, e.g. the method can be carried out using equipment located outside of the housing of the cell. Current density profile data may comprise a magnitude, direction and/or rate of change of internal currents and current densities in the cell. By 'profile' data it is meant that this data is linked to the area/dimensions of the cell. For example, the current density may be coupled to spatial coordinates and/or mapped onto a 2D or 3D image if the cell or a matrix.

Magnetic field sensors that monitor the cell in the passive configuration can be capable of monitoring the development of the Solid-Electrolyte Interface (SEI) layer which develops after the first charge cycle during the conditioning stage (also known as formation). This is because the SEI formation creates a one-time parasitic current flow which is determined from the magnetic field measurements detected by the magnetic field sensors. Inhomogenities in the layer and other defects can also be detected and determined in this way.

Thus, viewed in another way, the present invention can be seen to provide a method of monitoring SEI growth in a battery cell, the method comprising using the magnetic field sensors to monitor a change in current density profile of a battery cell during a conditioning stage of a cell production process.

The magnitude and/or rate of change of the detected magnetic field may also be used to determine a rate of SEI layer formation within the cell.

Thus the method may be performed during a pre-use conditioning stage of the cell during the fabrication of the battery cell. In this way, the fabrication process of battery cells can be streamlined in the factory environment by removing cells that have defects or have not responded as well to the conditioning process as others within a batch.

The conditioning stage may take place at a temperature above 25° C., optionally at 30° C. or above, e.g. 40° C. or above, and/or the conditioning stage may be performed for a period of one week or more, for example more than three weeks and/or may be up to five weeks. The conditioning stage may comprise an ageing process for the cell and the condition of the cell, as determined from the current density profile data, may be used to determine whether to continue with conditioning the cell during the pre-use conditioning stage, modify the conditioning or to stop the conditioning and/or reject the cell. As discussed above, it is expensive and environmentally unfriendly to maintain large temperature controlled areas, particularly at high temperatures in which to hold the cells as they age. It is therefore preferable to characterise and identify defective cells early in order to reduce the amount of temperature controlled space required.

The determining of a condition of the cell may comprise one or more of: assessing growth of a solid electrolyte interface within the cell; detecting one or more defects within the cell; and detecting inhomogeneities within parts of the cell introduced during manufacture.

The method may comprise repeating the steps of measuring a magnetic field, determining current density profile data and determining a condition of the cell using that current density profile data, in order to monitor developments in the condition of the cell. In this way the possible defects and/or inhomogeneities within parts of the cell may be monitored over time.

Such monitoring over time may be carried out at intervals, wherein the intervals are a duration of at least three hours or more, optionally twelve hours or more; wherein the intervals are a duration of 72 hours or fewer, optionally less than 50 hours; and/or wherein the intervals are a duration of the order of 12-36 hours, optionally 24 hours.

The cell may be in a state of full charge or partial charge when the method is performed. The state of partial charge may be between 20% and 90% of a theoretical full charge (i.e. 100% theoretical capacity) of the battery. Thus, a fully charged battery cell may be considered as being charged to more than 90% of theoretical capacity. The method may be performed before an external electrical load has been placed across terminals of the cell. When cells are first manufactured, they may be formed in a state of charge (e.g. lithium metal cells). By carrying out the method on such cells in a state charge, no active charging of the cell has to be carried out before the pre-conditioning process. Large loads applied to a cell during a formation period can damage the cell and/or result in the SEI layer being larger (thus reducing capacity). In some cases it is therefore desirable to avoid applying any load to the cell before the formation period.

Alternatively, the method may comprise charging of the cell. For example, if the cell is not in a state of partial charge after manufacturing, e.g. lithium ion with Nickel Managenese Cobalt (NMC). The charging of the cell may be carried out such that the cell is in a state of full or partial charge. By performing the method when the cell is in a state of full charge, internal currents should be larger and thus be more easily detected.

The method may comprise generating a current density image of the battery cell based on a determined current density profile. Such current density images have been found to make it easier to visualise the internal state of the battery and changes over time in order to identify possible faults and inhomogeneities within parts of the cell.

The generation of a current density image may be based on the fact that the measured magnetic field is a convolution of the current density and a magnetic field propagator function.

The method may comprise transporting the cell into a magnetically shielded environment, and the magnetically shielded environment may comprise a magnetically shielded tunnel. The magnetically shielded tunnel may be substantially cylindrical. The transporting of the cell may comprise moving the cell through the tunnel on a positioner such as a conveyor. The cell may move along an axis of the tunnel. The plurality of magnetic field sensors may be arranged within the magnetically shielded tunnel as an array of sensors, for example, as a line array, which extends in a direction transverse to the axis of the tunnel. The conveyor may be arranged to pass under the array of sensors. The magnetically shielded environment prevents any external sources of magnetic noise from outside of the environment from affecting the measurements obtained by the magnetic field sensors, such that a more accurate current density profile can be determined. By utilising the tunnel configuration, the method can easily be incorporated into a factory setting, whereby a large a number of battery cells can be transported and characterised in a continuous manner along the conveyor.

The plurality of magnetic field sensors may be arranged in an array and the current density profile may be determined across the entire area of the cell. For example, the magnetic field sensors may be arranged in a line array or in a two dimensional array (i.e. where the magnetic field sensors are spaced in both an x and y direction with respect to each other).

The magnetic field sensors may be arranged in a sensor array which is moved relative to the cell, the magnetic field sensors collectively measuring a band of the magnetic field adjacent the cell, the band extending in a transverse direction to a direction of relative movement as the sensor array passes over a surface of the cell. In this way, each sensor may be used to measure a larger area of the battery cell. The step of measuring the magnetic field may be carried out whilst the cell and magnetic field sensors are moved relative to one another such that each magnetic field sensor is scanned across an area. Preferably the cells are moved relative to the array but it will be appreciated that other forms of relative movement could be possible. For example, the array may be moved with respect to the cells or both the array and the cells could be moved. The array could also be made large enough to cover the entire area of the cell and produce a full image of the cell without relative movement being required.

The magnetic field sensors may be configured to measure only electrochemical self-discharge of the cell.

The magnetically shielded environment may be shielded by a magnetic shield comprising a material with a magnetic permeability that is chosen to allow the magnetic field sensors to measure magnetic fields caused by internal currents of the battery cell in the passive state.

Alternatively, or in addition to magnetic shielding, the method could use common mode rejection in order to subtract a detected noise signal from the overall measurements of the plurality of magnetic field sensors (i.e. the noise signal is detected with a different sensor that is slightly further away from the cell, such that it does not substantially detect the internal currents, and monitors only the background magnetic field noise).

The magnetic field sensors used to measure the magnetic field of the cell may be atomic magnetometers. The atomic magnetometers may be optically pumped magnetometers, such as those referred to in US Patent Application No. 2004/0140799. Optically-pumped magnetometers (OPMs) based on alkali vapours are some of the most sensitive devices available today, exceeding that of cryogenically cooled, superconducting devices and so provide the most accurate measurements. OPMs are also relatively small in size, between 3 and 5 mm$^2$, or 4 mm$^2$ or smaller.

The magnetic field sensors may be in contact with a surface of the cell or within less than 10 mm of a surface of the cell during measurements. By placing the magnetic field sensors as close to the cells as possible (e.g. within 10 mm, 5 mm or even within 2 mm of the cell), the system will be able to identify small differences in magnetic field that would be difficult to identify otherwise.

It will be appreciated that the plurality of magnetic field sensors may be any magnetic sensors/magnetometers having the required sensitivity for a particular application. These may include, but are not limited to: OPMs; Hall probes; fluxgates; magneto-resistive sensors; and magneto-electric sensors. The magnetic field sensors may comprise any combination of the different types of sensors described herein.

The plurality of magnetic sensors may measure both the magnitude and direction of the magnetic field. In this way, the current density profile data may include both a magnitude of current density and a direction of the current.

The plurality of magnetic sensors may measure only the magnitude of the magnetic field, known as total field or scalar magnetic sensors. In such cases the plurality of magnetic sensors may be arranged to calculate the magnetic field gradient and thus infer the direction of the current.

The method may include steps of determining a magnitude and/or direction of the current within the battery cell.

The method may also be applied to a cell of a used battery. In this way, the method can be used to quantify degradation of used cells and identify any soft short circuits within them. Such soft short circuits may render a cell unsuitable for re-use.

The method may also be used for interim inspection of cells in safety critical applications, such as on aircraft.

The method can also be employed at the developmental stage of battery cells in order to characterise current flow in cell/tab and connector designs, and validate electrochemical models.

The method may comprise the determination of a C rate for the self-discharge of a cell. A C-rate is a measure of the rate at which a battery is discharged relative to its maximum capacity. A 1Ch$^{-1}$ rate means that the discharge current will discharge the entire cell in one hour. The method may comprise determining if a cell meets a predetermined standard of C rate, e.g. 1000 h$^{-1}$.

In a second aspect, the present invention may extend to a system for non-invasive characterisation of a cell for a battery. It will be appreciated that such a system may be configured to carry out any of the methods described above in relation to the first aspect and that any of the above described methods may use any one or a combination of features of the systems described below.

The system may comprise: a magnetic shield for shielding an environment from background magnetic field noise; a positioner for positioning an at least partially charged cell in the magnetically shielded environment; a plurality of magnetic field sensors located within the magnetically shielded environment, wherein the magnetic sensors are configured to be disposed adjacent to the cell when the cell has been positioned; and a controlling and processing subsystem, wherein the controlling and processing subsystem is configured to take measurements with each respective magnetic sensor of a magnetic field local to each respective magnetic sensor and determine current density data across the cell based on the magnetic field measurements; wherein the cell is in a passive state, and wherein the magnetic field sensors have a sensitivity such that they are capable of measuring magnetic fields caused by internal currents of the cell in the passive state.

By a magnetically shielded environment it is meant that the magnetic field noise in the environment is low enough such that the magnetic field sensors are able to measure magnetic fields caused by internal currents of the battery cell in the passive state; for example, wherein the maximum background magnetic noise in the shielded environment is less than 1 pT.

Alternatively, or in addition to the magnetic shield, the system may comprise a second plurality of magnetic field sensors, wherein the second set of magnetic field sensors measure background magnetic field noise and the system is configured to use common mode rejection to remove magnetic field noise instead of/in addition to magnetic shielding, i.e. in order to subtract a detected noise signal from the overall measurements of the (first) plurality of magnetic field sensors. In this way, the magnetic shield may be omitted.

The system may comprise the battery cell and the battery cell may be within the magnetic shield or within an environment sensed by a second plurality of magnetic field sensors.

As previously discussed, the magnetic field sensors may be arranged in an array, such as a line of magnetic field sensors or a two dimensional spatial arrangement of magnetic field sensors.

The size of each of the plurality of magnetic sensors may be less than 10 mm$^2$, preferably around 4 mm$^2$ (e.g. OPMs). In order to determine current density with high spatial resolution, (e.g. down to or below 1 cm$^2$) an array of compact sensors is required. By utilising small sensors, such as OPMs, the sensors can be arranged in a compact array close to one another to achieve the required spatial resolution.

For the same reasons, each magnetic field sensor may be spaced (as measured from an outside edge of the sensor) less than 10 mm, preferably less than 5 mm and more preferably in contact with any adjacent magnetic field sensors and the plurality of magnetic field sensors may be positioned within at least 10 mm of a surface of the cell when the measurements are taken, optionally within 5 mm or even 2.5 mm of a surface of the cell.

The magnetic field sensors may be equally spaced from one another or some may be arranged closer together in certain areas (if for example, particular areas of a cell require or might benefit from a higher special resolution of current density measurements, or if a particular area of the cell is more likely to have a defect). The magnetic field sensors may be in contact with a housing of the cell.

The battery cell according to any aspect may be a lithium-ion battery cell, and may be for powering an electric vehicle.

The magnetic shield may comprise a material with a magnetic permeability such that the magnetic field sensors are able to measure magnetic fields caused by internal currents of the battery cell in the passive state, wherein the material is preferably mu-metal, and/or the maximum background magnetic noise in the shielded environment is less than 1 pT.

The magnetic shield may incorporate a degaussing mechanism to temporarily remove permanent magnetic properties of ferromagnetic materials, e.g. nickel tabs, which may complicate the measurement of small magnetic field. The degaussing process may involve applying an alternating magnetic field to the material once it enters the magnetically shielded environment and gradually reducing the amplitude of the field until the residual magnetic field is sufficiently small (e.g. less than 1 nT).

The system may comprise a display and/or a human machine interface, wherein the controlling and processing subsystem is configured to generate a current density image of the battery cell based on the determined current densities and the current density image is displayed on the display or human machine interface. A human machine interface may also be used by an operator to control the system, for example by controlling the interaction between the magnetic field sensors and the cells such as their possible relative movement or selecting a timing when measurements are taken.

In a third aspect, the present invention relates to a method that may be employed in a battery pack during use to provide real-time monitoring data for use in battery management systems (BMS), such as for state of charge (SoC) and state of health (SoH). Such a method is similar to the method described above in relation to the first aspect except the battery cell is not in a passive state. Instead, the measurements of magnetic field are taken in an active configuration, when the cell is being charged or discharged. Such a method may also be used to monitor the current flow in battery connectors (busbars) and predict temperature variation.

As such, according to the third aspect, the present invention relates to a method for non-invasive characterisation of a cell for a battery, the method comprising: measuring a magnetic field generated by the cell using a plurality of magnetic field sensors positioned adjacent to the cell, the measuring producing magnetic field sensor data, wherein the measuring is performed while the cell is in an active state; determining current density profile data across the cell based on the magnetic field sensor data; and determining a condition of the cell using the current density profile data.

The method may use any of the previously described magnetic field sensors, in particular the atomic magnetometers and optically pumped magnetometers described above.

The determining of a condition of the cell may comprise determining a state of charge (SoC) and/or state of health (SoH).

There is a need for accurate and timely estimation of SoC, SoH and thermal properties of batteries, particularly in the transportation sector. This would lead to the effective elimination of the possibility of batteries overheating and causing fires. In addition this will increase the life-cycle of batteries, and reduce the cost of early retirement. Furthermore, the reliable prediction of temperature variability will decrease the cost of cooling systems.

Current density imaging within battery cells provides new spatial information on the current flow within battery cells, which can be used to more accurately infer the SoC and SoH of batteries and highlight the presence of manufacturing faults. The technique can also be used to assess and improve battery design and manufacturing processes. Developers of new cell chemistries and formats currently rely on computational electrochemical models to predict current and/or ion flow characteristics. This system may provide an experimental technique to directly validate these models.

It will be appreciated that the methods of the first and second aspect may comprise any one or a combination of the steps described in Appendix 1 and that the method of the third aspect may comprise any one or a combination of the steps from Appendix 2. Appendices 1 and 2 are discussed in more detail below.

The method may also be used during normal battery operation, making it suitable for in-vehicle deployment, meaning that faults can be detected and isolated more rapidly than existing techniques such as temperature sensors; this is particular relevant in safety critical situations such as aerospace.

It will be appreciated that the method according to the third aspect may include some of the features described above in relation to the first aspect and second aspect.

It will also be appreciated that the system of the second aspect may be adapted to perform the method of the third aspect. It is important to note that in doing so, both the magnetic shielding and/or the second plurality of magnetic field sensors (for common mode rejection) may be omitted from the system as the larger internal currents produced by the cell in the active state may result in the background magnetic field noise being negligible.

FIGURES

Certain example embodiments will now be described by way of example only and with reference to the accompanying drawings, in which.

DETAILED DESCRIPTION

Passive Configuration

Figure 1:
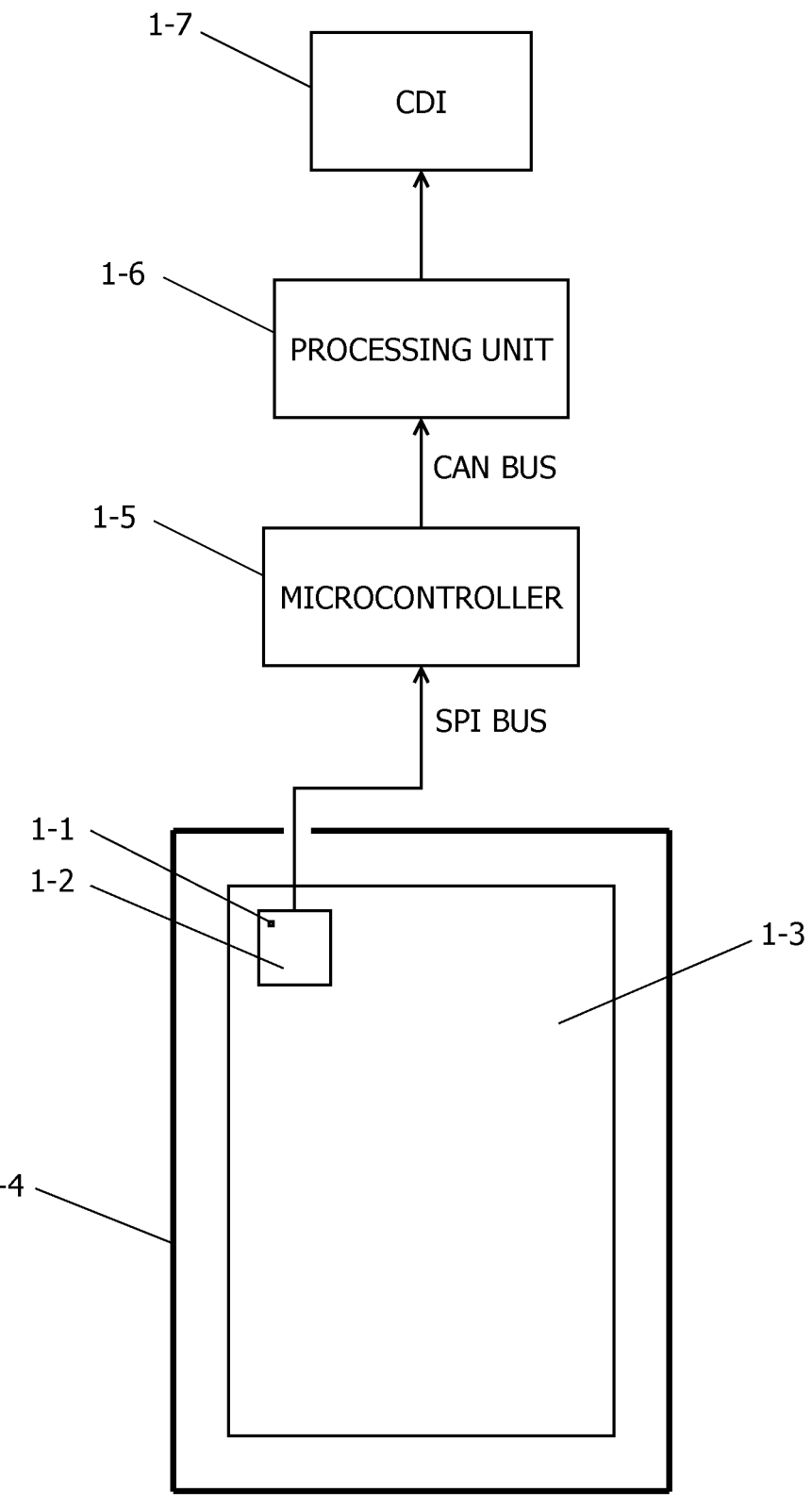
FIG. 1 shows a schematic view of a battery characterising system which uses a single sensor.
Figure 2:
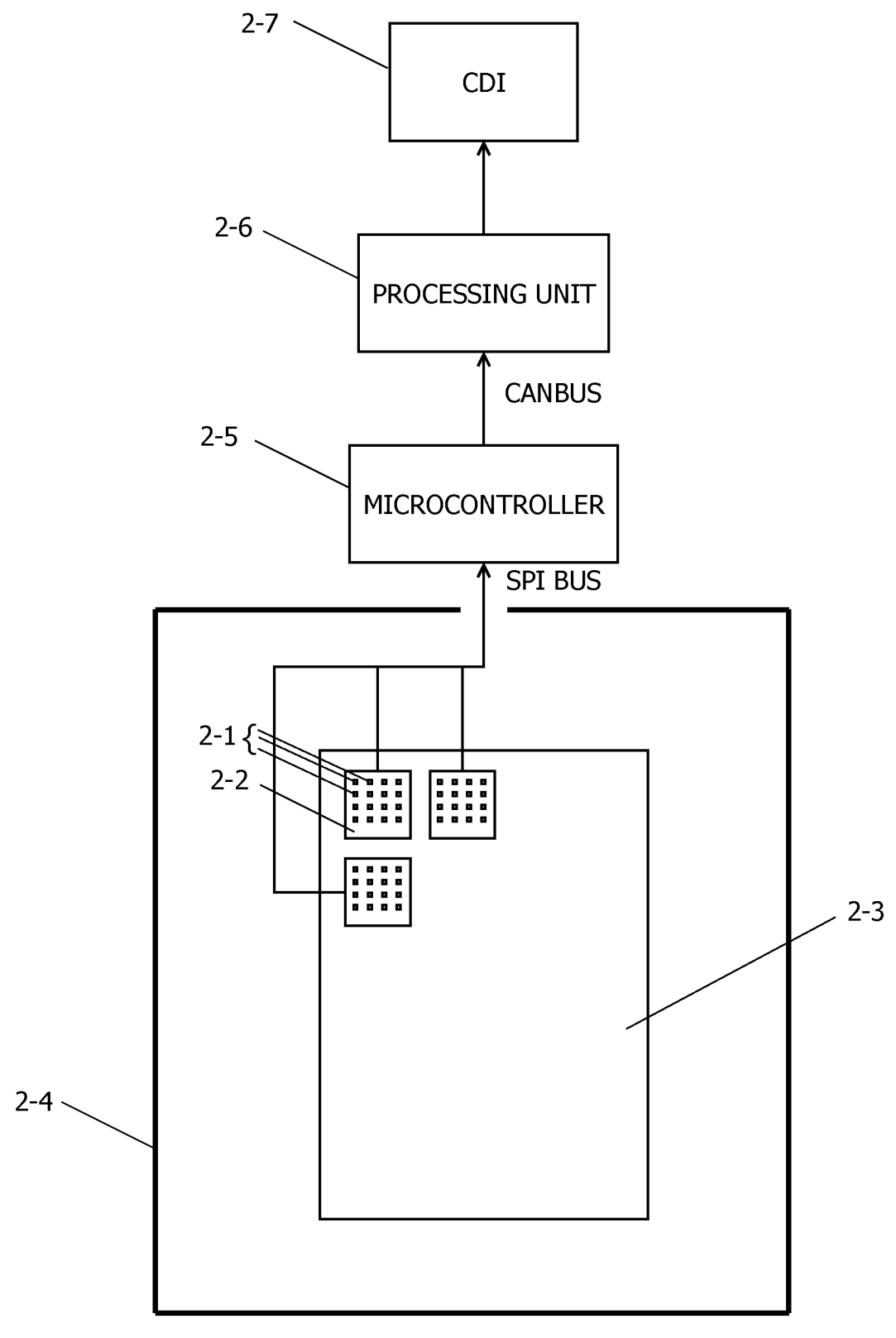
FIG. 2 shows a schematic view of a battery characterising system which uses an array of individual sensors.

Open circuit (i.e. passive/at rest) tests of a battery or other charge storage device can be taken to measure the self-discharge, e.g. the ion flow within the battery as it discharges through its own resistance. These are exhibited through very small magnetic field changes which require a magnetically shielded environment (for example contained in mu-metal shielding). Two examples of open circuit tests are shown in FIGS. 1 and 2 respectively. These tests can indicate self-discharge characteristics of cells under test and diagnose other faults and/or defects.

FIG. 1 shows a battery characterising system which uses sensors 1-1 on a Printed Circuit Board (PCB) 1-2, which is placed on a battery cell 1-3 located in a magnetically shielded environment 1-4. The digital sensor readings are transmitted via a Serial Peripheral Interface (SPI) bus to a microcontroller unit 1-5. The microcontroller unit converts the digital readings given by the sensor to magnetic field readings and these are sent via a CAN bus to the processing unit 1-6. The processing unit combines magnetic field readings taken at various locations and/or time intervals using an inverse method algorithm, described in Appendix 1, to produce Current Density Images (CDI) 1-7. The CDIs are used to determine a condition of the cell.

CDIs are also taken when the battery is at a low SoC. The battery is charged to a known level using a voltage set by a battery charger. CDIs are taken again. The difference between these two values will provide the self-discharge current density of the battery, providing a new assessment of cell SoH.

FIG. 2 shows a battery characterising system which uses an array of individual sensors 2-1 on a series of PCBs 2-2. In this example, 16 individual sensors are mounted on each of the PCBs and three PCBs are shown. The PCBs are all placed on a battery cell 2-3 located in a magnetically shielded environment 2-4. The individual sensor readings measured by each PCB array are transmitted concurrently by an SPI bus to a microcontroller unit 2-5. The microcontroller unit converts the digital readings from each PCB to magnetic field readings and these are sent via a CAN bus to the processing unit 2-6. The processing unit combines the arrays of concurrent magnetic field readings taken at various time intervals to create the CDI on a display 2-7. The technique for obtaining the CDI from the magnetic field readings is described in Appendix 1.

Figure 6:
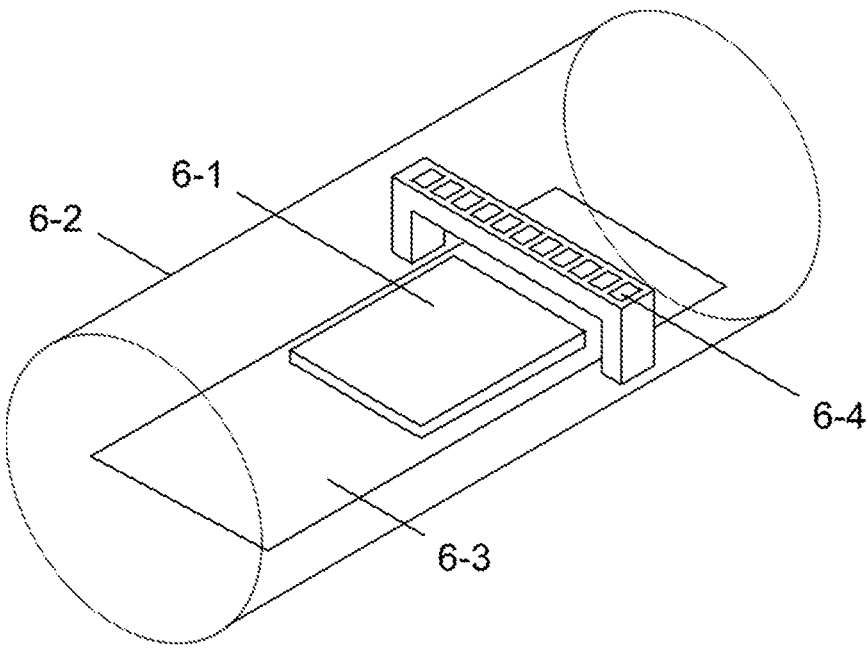
FIG. 6 shows an isometric representation of a battery characterising system comprising an array of sensors, a magnetically shielded tunnel and a conveyor belt.

FIG. 6 shows a battery characterising system comprising an array of sensors 6-4, a magnetically shielded tunnel 6-2 and a conveyor belt 6-3. This system can be used for measuring the current density profile and assessing the quality of individual battery cells 6-1, in this case pouch cells, in a factory testing environment.

Successive cells 6-1 are transported continuously into and through the magnetically shielded tunnel 6-2 on the conveyor belt 6-3. A plurality of magnetic field sensors are arranged in the array (eleven sensors are shown in a line array in FIG. 6). Each cell 6-1 passes under the line array of sensors 6-4 and magnetic field measurements are taken at predetermined intervals. In this way, readings are taken over the length of the cell 6-1 as it travels underneath the array of sensors 6-4. The line array of sensors spans the full width of the cell 6-1. This results in a fully scanned image of current density data for the entire area of each cell on the conveyor belt undergoing testing.

Method

Figure 5:
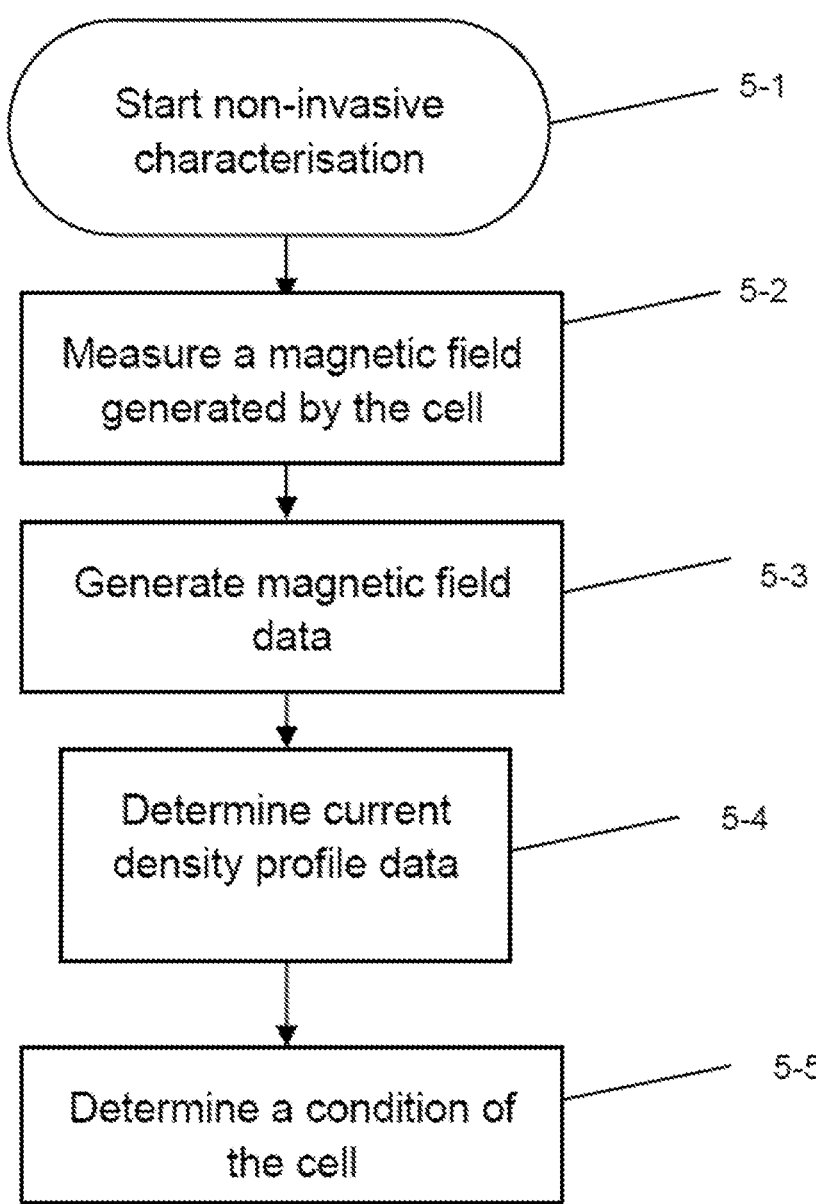
FIG. 5 shows a flow chart of a method for non-invasive characterisation of a charge storage device, for example a cell for a battery.

FIG. 5 shows a flow chart of a method for non-invasive characterisation of a cell for a battery. This method is carried out using the system described above in relation to FIG. 2. The method starts at step 5-1, when a cell in the passive state is in position with a plurality of magnetic field sensors positioned adjacent to the cell. At step 5-2, a magnetic field generated by the cell is measured using the plurality of magnetic field sensors and at step 5-3 magnetic field sensor data is generated based on the measurements.

The method then proceeds to step 5-4, where current density profile data across the cell is determined based on the magnetic field sensor data which is used in step 5-5 to determine a condition of the cell.

Active Configuration

In contrast to the passive configuration described above, in which no load is applied to the battery cell and it is in an open circuit, measurements can also be taken during charging and discharging (i.e. in an active configuration). These magnetic readings are larger and can be obtained in an unshielded environment by use of electronic noise cancellation techniques.

Figure 3:
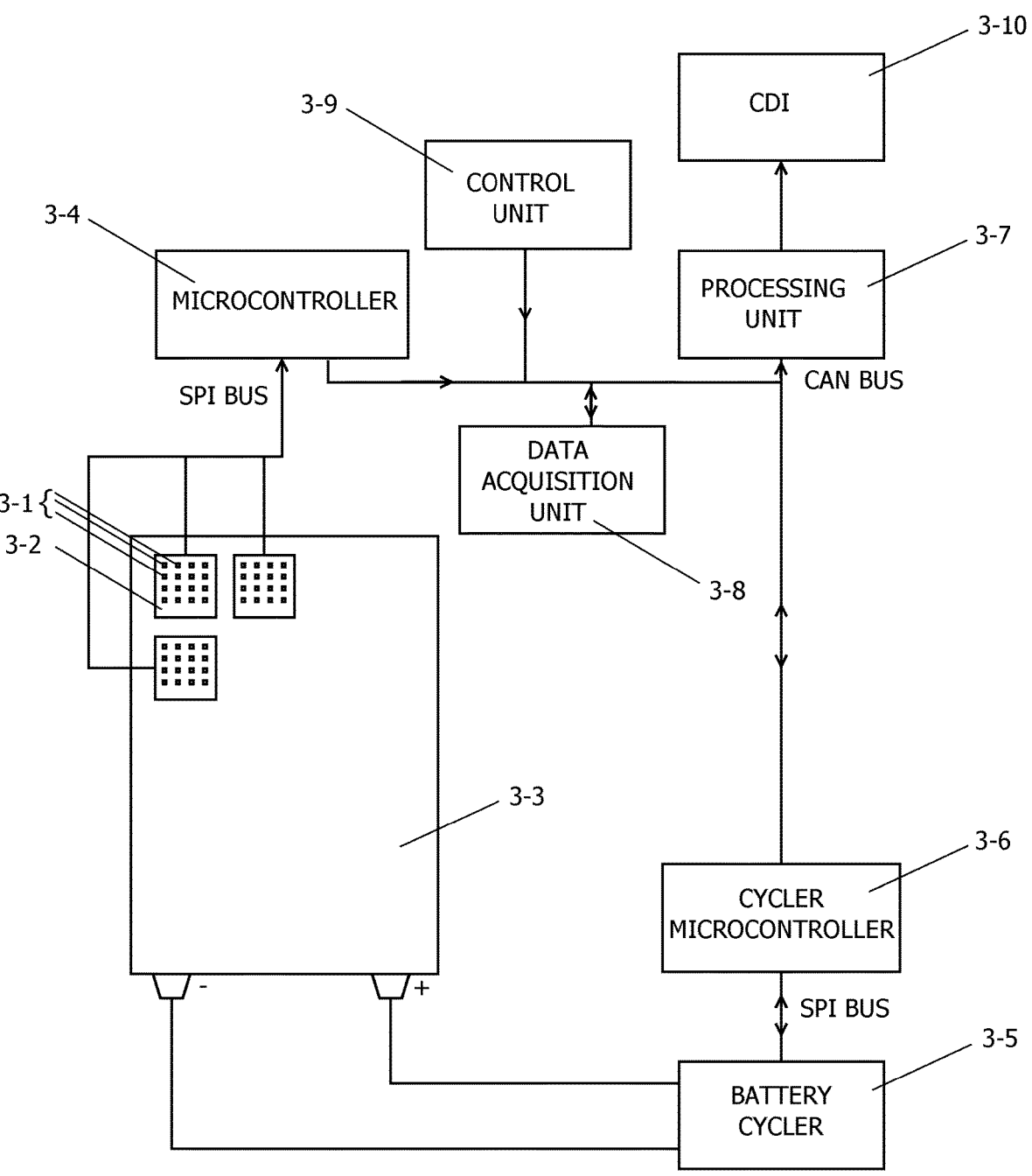
FIG. 3 shows a schematic view of a battery characterising system to be used in an active configuration.

FIG. 3 shows a battery characterising system to be used in an active configuration. In this example an array of individual sensors 3-1 on a series of PCBs 3-2, mounted on a battery cell 3-3 provide digital readings. A single sensor could also be used. The digital readings are fed to the microcontroller 3-4 via an SPI bus. A battery cycler 3-5 provides constant current charge and discharge cycles to the battery and this is controlled by the cycler microcontroller 3-6 via an SPI bus connection which also feeds data from the battery cycler 3-5, back to the cycler microcontroller 3-6. The readings from the microcontrollers 3-4 and 3-6 are fed to the data acquisition unit 3-8. The processing unit 3-7 subsequently retrieves time resolved readings from the data acquisition unit and processes them using an inverse method algorithm to create CDI output 3-10. The mechanism for generating the CDI output is described in Appendix 1. Overall control of the characterisation system is provided by the control unit 3-9.

The battery characterisation system can be incorporated into the battery management system (BMS) of an energy storage system, in particular one incorporated in a vehicle.

Figure 4:
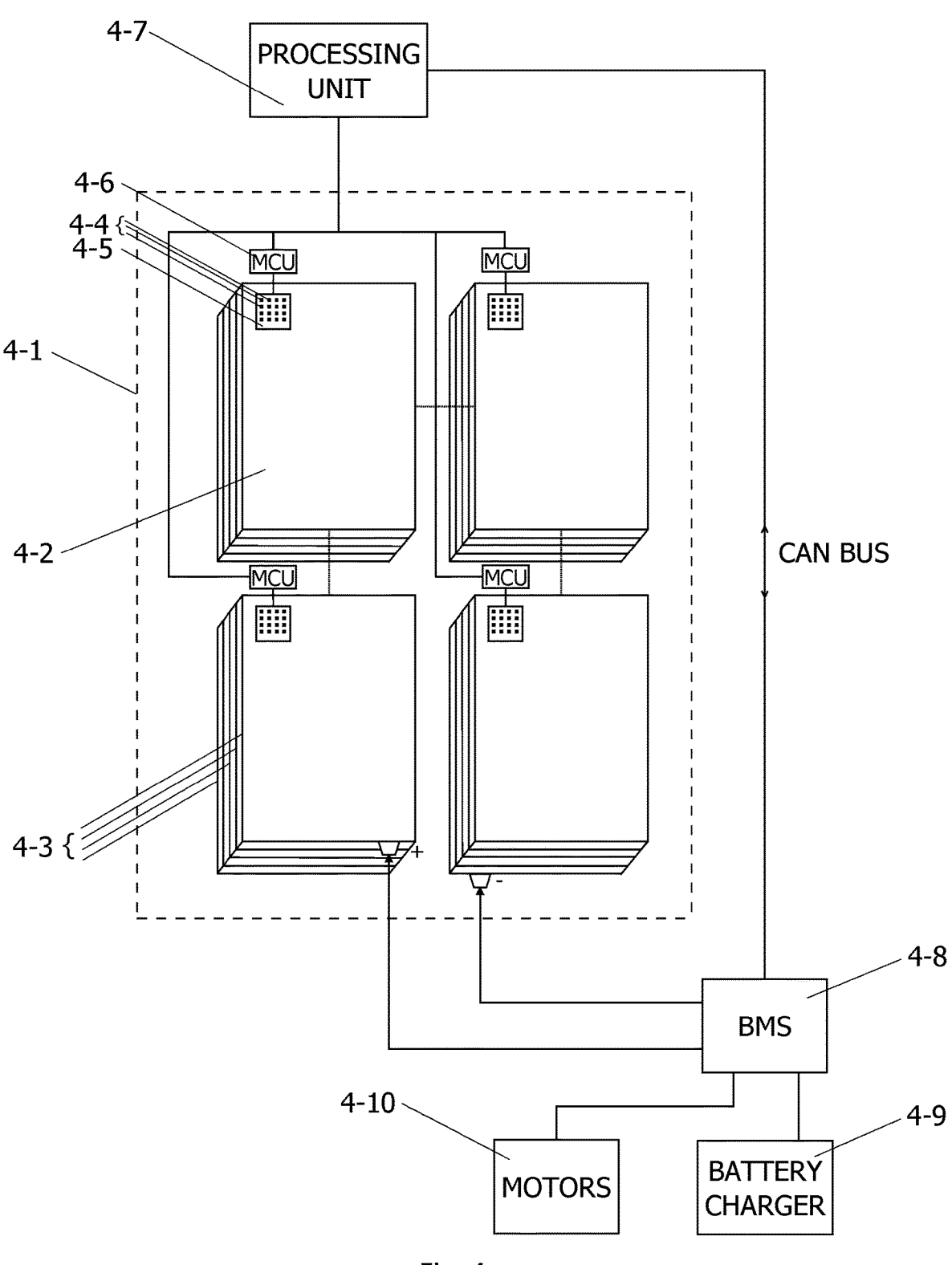
FIG. 4 shows a battery monitoring system for in-situ use providing real-time readings of current density within battery cells, modules and packs.

FIG. 4 shows a battery monitoring system for in-situ use providing real-time readings of current density within battery cells, modules and packs. In this example, a battery pack 4-1 is shown comprising four modules 4-2 connected to each other in series, each module comprising four cells 4-3. An array of sensors 4-4 (16 shown) on PCB 4-5 is mounted on each module 4-2. The digital readings from each PCB are fed to a microcontroller unit 4-6 over an SPI bus. An array of PCBs 4-5 could also be utilised, feeding into the microcontroller 4-6 for each module 4-2. Each of the microcontrollers 4-6 converts the digital readings from the PCBs 4-5 to magnetic field readings and these are fed to the processing unit 4-7. The processing unit 4-7 combines these readings with module current and voltage readings from a Battery Management System (BMS) 4-8 and using an inverse method algorithm, the processing unit produces current density images across the battery pack (described in Appendix 1). The current density images are processed to produce a measure of heat generation from each battery module. It also provides information about the State of Charge (SoC) and State of Health (SoH) of the pack (as described in Appendix 2). The BMS 4-8 uses feedback data from the processing unit 4-7 to control power input/output of the cells and modules of the battery pack. The BMS is thus able to regulate the permissible voltage and current to/from the battery charger 4-9 and motors 4-10 to optimise the use of the battery pack.

APPENDIX 1—PRODUCTION OF CURRENT DENSITY IMAGES (CDI) FROM MAGNETIC FIELD READINGS

The method of measuring current densities relies upon the conversion of magnetic field readings from the sensor arrays.

This conversion can be done by making use of the fact that the magnetic field is a convolution of the current density $J_i$ and a magnetic field propagator function G.

This convolution can be expressed as the multiplication of $j_i$ and $g_i$ in Fourier space.

The Fourier transform of the current density is obtained by dividing the two-dimensional Fourier transform of the magnetic field by the Fourier transform of the propagator function.

Specifically, starting from the magnetic field readings $B_i(x,y)$ a FFT is applied to give $b_i(k_x,k_y,z)$.

Similarly, $G_i(x,y)$ is transformed to give $g(k_x,k_y,z)$.

$j_i(k_x,k_y)$ is then obtained from $b_i(k_x,k_y,z)/gi(k_x,k_y,z)$.

A spatial filter can be applied to $j_i(k_x,k_y)$ to remove higher frequency terms and avoid aliasing An inverse Fourier transform, $FFT^{-1}$ is then applied to $j_i(k_x,k_y)$ to yield $J_i(x,y)$.

APPENDIX 2—GENERATION OF SOC AND SOH INFORMATION FROM CDI

A known current (during charging) or a known load (during discharging) is applied to the battery and the current density is measured at different locations across the battery unit to produce the CDI in the manner described in Appendix 1.

The CDI are normalised based on the known current to determine the relative proportion that each part of the battery contributes to the overall current (normalised CDI).

The normalised CDI (relative to the active charge/load) at a particular location in the battery varies with the SoC. Thus the SoC can be determined by calibrating the relationship between normalised CDI readings taken during a charge/discharge cycle The calibration between normalised CDI readings and SoC can be performed using linear algebra (in the case of a linear relationship) or machine learning (if the behaviour is significantly non-linear).

The calibrated relationship provides a direct SoC reading as a function of CDI readings and known current.

The SoH of the battery can be determined in two different ways:

a) by noting the change in SoC with energy charged/ discharged (i.e. calculating the overall battery capacity); and b) by noting the evolution of the SoC calibration over time (to identify irregular degradation of the cells potentially leading to early failure).

The invention claimed is:

1. A method for non-invasive characterisation of an electrical charge storage device, the method comprising the following steps (i) to (iii):

(i) using a plurality of optically pumped magnetometers positioned adjacent to the electrical charge storage device to directly measure a magnetic field generated by electrochemical self-discharge of the electrical charge storage device, the measuring producing magnetic field sensor data, wherein the measuring is performed while the electrical charge storage device is in a passive state;

(ii) determining current density profile data across the electrical charge storage device based on the magnetic field sensor data; and (iii) determining a condition of the electrical charge storage device using the current density profile data.

2. A method as claimed in claim 1, wherein the electrical charge storage device is a cell for a battery.

3. A method as claimed in claim 2, wherein the method is performed during a pre-use conditioning stage of the cell during the fabrication of the battery.

4. A method as claimed in claim 3, wherein the pre-use conditioning stage takes place at a temperature above 25° C. and/or the pre-use conditioning stage is performed for a period of one week or more.

5. A method as claimed in claim 3, wherein the pre-use conditioning stage comprises an ageing process for the cell.

6. A method as claimed in claim 3, wherein the condition of the cell, as determined from the current density profile data, is used to determine whether to continue with conditioning the cell during the pre-use conditioning stage, to modify the conditioning, to stop the conditioning, and/or to reject the cell.

7. A method as claimed in claim 2, wherein the determining of a condition of the cell comprises one or more of:

assessing growth of a solid electrolyte interface within the cell;

detecting one or more defects within the cell; and detecting inhomogeneities within parts of the cell introduced during manufacture.

8. A method as claimed in claim 2, wherein the method comprises repeating steps (i) to (iii) in order to monitor developments in the condition of the cell.

9. A method as claimed in claim 8 wherein the monitoring of developments in condition of the cell is used to assess a rate of growth of a solid electrolyte interface within the cell.

10. A method as claimed in claim 2, wherein the steps (i) to (iii) are repeated at intervals;

wherein the intervals are a duration of at least three hours or more, optionally twelve hours or more;

wherein the intervals are a duration of no greater than 72 hours; and/or wherein the intervals are a duration in a range of 12-36 hours.

11. A method as claimed in claim 2, wherein the magnetic field sensors measure only electrochemical self-discharge of the cell.

12. A method as claimed in claim 2, wherein the method is applied to a cell of a used battery, to identify soft short circuits within the cell or to determine the self-discharge C-rate of the cell.

13. A method as claimed in claim 1, wherein the electrical charge storage device is in a state of full charge or partial charge when the method is performed, and/or wherein the method is performed before an external electrical load has been placed across terminals of the electrical charge storage device.

14. A method as claimed in claim 1, wherein the method comprises generating a current density image of the electrical charge storage device based on the determined current density profile.

15. A method as claimed in claim 1, wherein the method further comprises transporting the electrical charge storage device into a magnetically shielded environment.

16. A method as claimed in claim 15, wherein the magnetically shielded environment incorporates a degaussing mechanism to temporarily remove residual magnetic field from ferromagnetic components of the electrical charge storage device.

17. A method as claimed in claim 1, wherein the magnetic field sensors are arranged in a sensor array which is moved relative to the electrical charge storage device, the magnetic field sensors collectively measuring a band of the magnetic field adjacent the electrical charge storage device, the band extending in a transverse direction to a direction of relative movement as the sensor array passes over a surface of the electrical charge storage device.

18. A method as claimed in claim 1, wherein the magnetic field sensors are positioned within a distance of less than 10 mm from a surface of the electrical charge storage device during measuring of the magnetic field.

19. A method as claimed in claim 1, wherein the method is applied to any of: a fuel cell; a super capacitor; an electrochemical device; and an electrostatic device.

\* \* \* \* \*